(12) United States Patent
Moriya et al.

(10) Patent No.: US 6,572,699 B1
(45) Date of Patent: Jun. 3, 2003

(54) METHOD AND APPARATUS FOR DETECTING MELT LEVEL

(75) Inventors: Masato Moriya, Hirabsuka (JP); Tadayuki Hanamoto, Hirabsuka (JP); Kazuhiro Mimura, Hirabsuka (JP); Toshirou Kotooka, Omura (JP)

(73) Assignee: Komatsu Denshi Kinzoku Kabushiki Kaisha, Hiratsuka (JP)

( * ) Notice: Subject to any disclaimer, the term of this patent is extended or adjusted under 35 U.S.C. 154(b) by 0 days.

(21) Appl. No.: 09/936,515

(22) PCT Filed: Mar. 16, 2000

(86) PCT No.: PCT/JP00/01609

§ 371 (c)(1),
(2), (4) Date: Sep. 14, 2001

(87) PCT Pub. No.: WO00/55396

PCT Pub. Date: Sep. 21, 2000

(30) Foreign Application Priority Data

Mar. 17, 1999 (JP) .......................... 11-071149

(51) Int. Cl.$^7$ .............................. C30B 15/20
(52) U.S. Cl. ........................ 117/15; 117/14; 117/201; 117/202; 117/208; 117/217

(58) Field of Search .............................. 117/14, 15, 201, 117/202, 208, 217

(56) References Cited

U.S. PATENT DOCUMENTS

| 4,508,970 | A |   | 4/1985  | Ackerman |
|-----------|---|---|---------|----------|
| 5,653,799 | A | * | 8/1997  | Fuerhoff ..................... 117/14 |
| 5,656,078 | A | * | 8/1997  | Fuerhoff ..................... 117/201 |
| 5,660,629 | A | * | 8/1997  | Shiraishi et al. ............. 117/201 |
| 5,961,716 | A | * | 10/1999 | White et al. .................. 117/14 |

FOREIGN PATENT DOCUMENTS

JP          5294785          11/1993

* cited by examiner

Primary Examiner—Felisa Hiteshew
(74) Attorney, Agent, or Firm—Varndell & Varndell, PLLC

(57) ABSTRACT

A melt level detector is provided for detecting the melt level of a CZ furnace by triangulation. The laser beam (2) from a laser source (1) is moved in radial directions of a crucible (14) in the CZ furnace to find a location where a photodetector system (5, 7) can receive the reflection (4) from the melt level (3), and the laser beam (2) is fixed at the location. Since the measurements thus take place within an extremely small angular range of the laser beam, the melt level (3) can be detected with little effect of noise on the melt level (3) while eliminating complexity of the device.

22 Claims, 20 Drawing Sheets

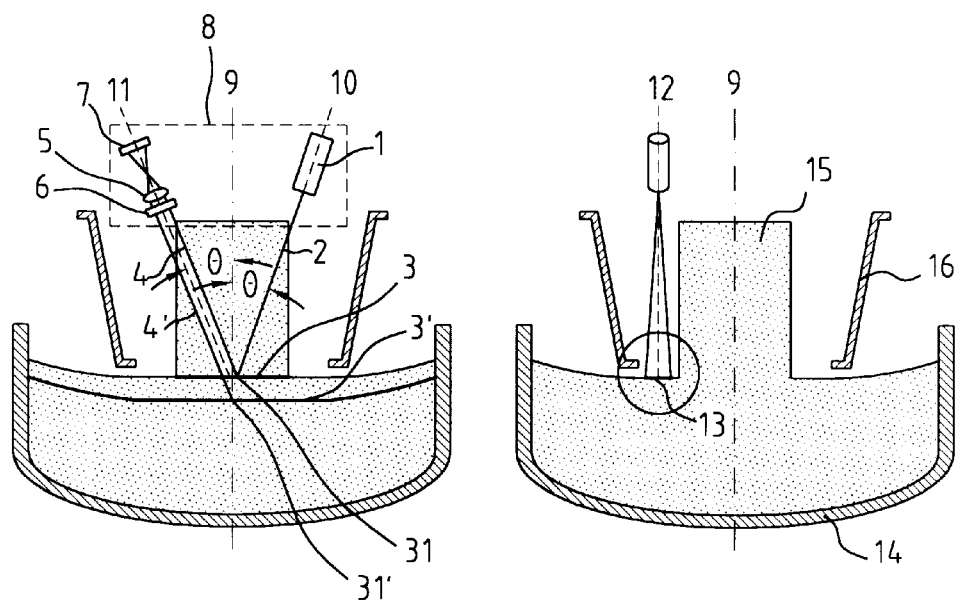
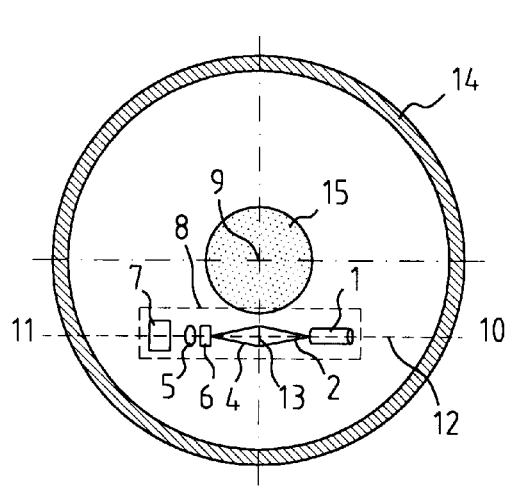
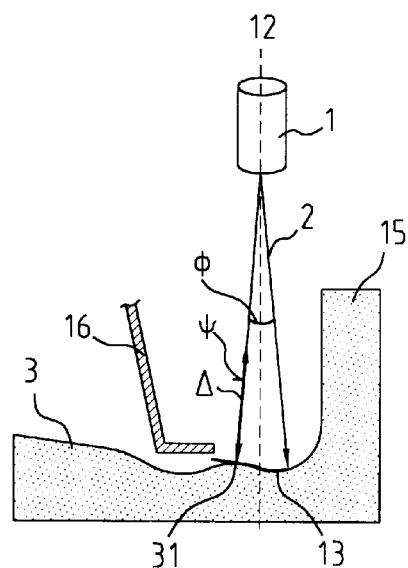
FIG.1(a)   FIG.1(b)
FIG.1(c)   FIG.1(d)

METHOD AND APPARATUS FOR DETECTING MELT LEVEL

CROSS-REFERENCE TO RELATED APPLICATIONS

This application is a U.S. national phase application of International Application No. PCT/JP00/01609 filed Mar. 16, 2000, which application was not published in English.

TECHNICAL FIELD

This invention relates to a method and apparatus for detecting the surface height (melt level) of a raw-material melt in a Czochralski monocrystal pulling apparatus, and more particularly to a method and apparatus for detecting the melt level of molten silicon.

BACKGROUND ART

Necessity of Detecting Melt Level

The Czochralski method (CZ method) is a method for pulling out monocrystalline ingots from melts of raw materials such as silicon in a crucible. In order to make crystals grow well, it is necessary to accurately detect the surface level (hereinafter "melt level") of a raw-material melt and to adjust the same.

Detecting and adjusting melt levels properly in a CZ monocrystal pulling apparatus is useful in controlling the relative positions of a heat shield and the melt level, or the relative positions of a heater and the melt level so as to promote stable crystal growth.

In particular, in currently existing CZ silicon monocrystal pulling apparatuses, normally, the thermal radiation from the heater and silicon melt are controlled and also a heat shield (or gas rectifying tube) for rectifying a gas flowing inside the furnace is installed. By appropriately performing the feedback control described above, and controlling the relative positions of the lower surface of the heat shield and the melt level (that is, the distance between them), the thermal hysteresis of the pulled silicon monocrystal and the impurity concentrations (oxygen concentration, etc.) therein can be made constant.

Melt Level Detection Apparatuses

In terms of conventional technology for melt level detection apparatuses, there are apparatuses such as that disclosed in Japanese Patent Publication (Kokoku) No. 3-17084. That conventional apparatus detects melt levels based on the principle of triangulation. More specifically, with that apparatus, as illustrated in FIG. 19 (FIG. 1 in this Publication), a laser beam 34 is projected onto the melt surface at an angle θ, the regularly reflected beam 38 is condensed by a lens 44, and the position of convergence 46 is detected by a photosensor 48. In this conventional apparatus, the enlarged projection 30 of the laser beam is received for the purpose of averaging the measurement variation caused by very small ripples 22 that develop in the surface of the melt surface 20.

However, there are other factors in the melt surface 3 that impair the flatness of that melt surface 3 besides the very small ripples noted above. Specifically, as illustrated in FIG. 2(*b*), in the portion of the melt surface 3 near a crystal 15, a meniscus 28 develops due to the surface tension near the growth surface of the crystal 15. Also, due to the rotation of the crucible 14 and the rotation of the crystal 15 being pulled, the surface becomes inclined in a parabolic shape across the entirety of the melt surface 3. As illustrated in FIG. 2(*c*), furthermore, when a gas rectifying tube 16 is brought close to the melt level 3, due to the discharge pressure of the inactive gas, there are cases where a depression is formed in the melt surface 3 near the bottom portion of the gas rectifying tube 16. Such inclinations as these in the melt surface 3 cause the direction of the regularly reflected beam from the laser beam used for measuring as noted earlier to be shifted (the inclination in the melt surface 3 being indicated by the angle Ψ in the figure), making effective reception of that beam difficult.

The above-described conventional discloses that the position where the photodetector unit is disposed is moved so as to catching the shift in the direction of the regularly reflected laser beam, caused by inclinations in the melt surface. The inclination Ψ in the melt surface 3 is closely related to the rotational speeds of the crucible 14 and of the crystal 15 and to the height of the gas rectifying tube 16 above the melt surface 3. Therefore, every time these pulling conditions are changed, the amount to move the position of the photodetector unit must be adjusted. Not only is that a troublesome task, but it is very difficult to precisely reproduce movement settings for the photodetector unit. When the movement adjustment is not done well, furthermore, it is possible that the regular reflected beam from the laser will not be able to be received and that melt surface detection will be disabled.

Furthermore, as illustrated in FIG. 20 (which corresponds to FIG. 3 in the Publication mentioned above, being a diagram illustrating changes in the regularly reflected laser beam relative to changes in the melt level), when the melt level changes (ΔL) largely, the positional shift (ΔY) in the regularly reflected beam becomes large, whereupon it becomes necessary to shift the light detector greatly, by that measure. In conjunction therewith, moreover, installation constraints develop, such as the necessity of having an observation port 40 of a size that corresponds with that large shift, or the need to provide enough space for the light detector to be able to move.

Furthermore, because the melt surface 3 reflects light as does a mirror surface, another problem arises in that, as illustrated in FIG. 15(*a*), scattered light at the emission port 29 of the laser source 1 is reflected by the melt surface 3, which is picked up in the photosensor 7 as a ghost 30 (a phenomenon which occurs frequently under conditions where the regularly reflected beam 4 is received through a lens 5) resulting in a deterioration in position detection precision. In this connection, in the conventional technology noted above, a band-pass filter is employed which passes only laser beam wavelengths, as a measure for distinguishing between the radiated light from the melt surface 20 and the received laser beam with good contrast. However, the wavelength of the scattered light at the emission port 29 of the laser source 1 and the wavelength of the laser beam that is regularly reflected by the melt surface 3 are mutually identical, wherefore the picking up of the scattered light at the emission port 29 by the photosensor 7 cannot be avoided with a band-pass filter.

DISCLOSURE OF THE INVENTION

An object of the present invention, which was devised with the problems noted above in view, is to provide a melt level detection apparatus and melt level detection method wherewith melt levels can be detected simply and precisely.

In order to resolve such problems as those noted above, in the melt level detection apparatus and melt level detection method according to the present invention, use is made of the shape of the surface that regularly develops on the surface of the melt, causing that to function as a kind of reflecting body (that is, a kind of reflecting body for causing the projected laser beam to be accurately guided to a photodetector attached at a prescribed location), and thus performing melt level detection accurately. As means to that end, scanning is performed in the radial directions of the crucible to search out a position at which the projected laser beam will be accurately guided to the photodetector.

The present invention, furthermore, was devised on the basis of certain points of view, namely that, in a CZ furnace, due to the rotation of the crucible itself and/or the rotation of the crystal being pulled out, a swell develops in the shape of a concentric circle centered on the axis of rotation of the crystal being pulled out, which is a regularly occurring phenomenon, and that, because the cross-section of that swell is parabolic, if scanning is done in the radial directions of the crucible, a position will always be found at which the projected laser beam will be guided accurately to the photodetector.

More specifically, the present invention provides a melt level detection apparatus and method such as those described below.

(1) A melt level detection apparatus comprising a laser beam projector and a photodetector at prescribed positions in a CZ furnace, wherein the laser beam projector projects a laser beam emitted from onto a surface of a melt, the photodetector receives the laser beam reflected from a site where the laser beam is projected, and a level of the surface of the melt inside the CZ furnace is detected based on principle of triangulation, wherein a position at which the laser beam projector projects is moved in radial directions of a crucible inside the CZ furnace, whereby the laser beam reflected from the surface of the melt scans a projection position at which the laser beam is received by the photodetector, and projection position of the laser beam is set at the position, whereby the level of the surface of the melt is detected.

The term "regularly" connotes a concept that of course embraces such things as a standing wave that exists more or less constantly under certain conditions, but also includes the assumption of a condition capable of existing as a stable condition when a prescribed certain time period is in view. In the embodiments of the present invention, that which is typical as a "regularly occurring undulation" is a stable concentric circular swell centered on the axis of pulling that is produced by the rotations of both the crystal being pulled out and the crucible. The reason for this is that, although these things behave as stable standing waves when a prescribed certain time period is in view, because such a surface condition changes moment by moment as the crystal is pulled up, in the embodiments of the present invention, it is more natural to suppose that "a condition is assumed that can exist as a stable condition when some prescribed certain time period is in view."

(2) The melt level detection apparatus described above, further comprising first light path alteration means for altering path of advance of the laser beam emitted from the laser beam projector and projecting the laser beam onto the surface of the melt, and/or second light path alteration means for altering path of advance of the laser beam reflected from the surface of the melt and guiding the laser beam to the photodetector.

(3) The melt level detection apparatus described above, wherein alteration of position to projection by the laser beam projector is performed by the first and second light path alteration means.

(4) Any of the melt level detection apparatuses described above, further comprising a beam attenuating filter which blocks light of a prescribed light intensity or below of light received by the photodetector.

(5) Any of the melt level detection apparatus described above, further comprising an angle adjusting mechanism which adjusts projection angle of the laser beam projector.

(6) The melt level detection apparatus described above, wherein the scanning of the projection position by the laser beam projector is performed up to a bottom portion of a heat shielding member disposed inside the CZ furnace; and position of the bottom portion of the heat shielding member is calculated by receiving also the laser beam reflected from bottom portion of the heat shielding member with the photodetector. The "heat shielding member" is an item that blocks the radiant heat from the surface of the melt, which may also have a function for rectifying the gas that is flown into the furnace.

(7) The melt level detection apparatuses according to any one of claims 1 to 6, wherein the photodetector comprises a two-dimensional photosensor which simultaneously detects two-dimensional positions of a measurement spot on an observation surface. The concept of a "two-dimensional photosensor for simultaneously detecting the two-dimensional position of a measurement spot on an observation surface" includes both the case where the two-dimensional photosensor itself doubles as a distance measuring sensor, and the case where the two-dimensional photosensor is provided separately from a distance measuring sensor.

(8) A melt level detection method for detecting a level of a surface of a melt inside a CZ furnace by using a laser beam projector and photodetector disposed at prescribed positions in a CZ furnace, based on principle of triangulation, wherein a position at which the laser beam projector projects is moved in radial directions of a crucible inside the CZ furnace, whereby the laser beam reflected from the surface of the melt scans a projection position at which the laser beam is received by the photodetector; and projection position of the laser beam is set at the position; and the projection position of the laser beam is set at that position.

(9) The method described above, wherein a beam attenuating filter which blocks light of lower light intensity than light of the laser beam emitted from the laser beam projector and regularly reflected from the surface of the melt is provided to eliminate ghosts other than the regularly reflected beam.

(10) The method described above, wherein the scanning is performed up to a bottom portion of a heat shielding member disposed inside the CZ furnace; and portions of the heat shielding member is detected by difference in reflectivity between the bottom portion of the heat shielding member and the surface of the melt.

(11) The method described above, wherein the photodetector comprises a two-dimensional photosensor which simultaneously detects two-dimensional positions of measurement spots on an observation surface; and the melt level and two-dimensional positions of measurement spots on the heat shielding member are detected.

(12) The method described above, wherein the scanning for detecting the level of the surface of the melt inside the CZ furnace based on the principle of triangulation is either performed at regular times or occasionally.

(13) The method described above, wherein the scanning performed occasionally is for finding a position where reflected beam receiving conditions are favorable, the scanning being stopped while the light receiving conditions are favorable, the scanning being resumed when light receiving conditions deteriorate and search is continued until a position is reached where reflected beam receiving conditions are favorable.

The present invention, described as in the foregoing, may be expressed in general terms as follows. Since the method according to the present invention is one that applies the principle of triangulation to a practically-used liquid, it is clear that the present invention can be applied to any liquid whatsoever as long as it can bring into being a stationary condition on the surface under certain established conditions.

(14) In a method of detecting a level of a liquid surface by emitting a laser beam from a prescribed position relative to the liquid surface whose level is to be detected, and receiving the laser beam reflected from the liquid surface whose level is to be detected, at a prescribed position different from the first-mentioned prescribed position whereby the level of the liquid surface is detected based on principle of triangulation, a method of adjusting direction of advance of the laser beam reflected from the liquid surface by utilizing slope of an undulation produced regularly in the liquid surface whose level is to be detected. What is meant by "utilizing" is not limited to cases of simply adjusting the direction of reflection, but also includes application cases such as where light is condensed using a concave surface.

(15) A method of detecting a level of a surface by emitting a laser beam from a prescribed position relative to the surface whose level is to be detected, and receiving the laser beam reflected from the surface whose level is to be detected, at a prescribed position different from the first-mentioned prescribed position whereby the level of the surface is detected based on principle of triangulation, wherein the method is a method for detecting a level of a surface that is emitting light, and reception of the laser beam is selectively performed by using a laser beam having a light intensity stronger than a light intensity of the surface whose level is to be detected, while receiving the laser beam through a beam attenuating filter positioned at an energy level between the light intensity of the laser beam and the light intensity of the surface.

This method also is a general method for projecting a laser beam onto a light emitting surface and performing triangulation, and, so long as that surface emits light, there is no particular limitation on the type (material, product quality, and so forth) or state (that is, solid, liquid, etc.) thereof.

BRIEF DESCRIPTION OF THE DRAWINGS

FIGS. 1(a) to 1(d) are block diagrams for illustrating the principle underlying a melt level the text and apparatus and method according to the present invention;

BEST MODE FOR CARRYING OUT THE INVENTION

Basic Configuration of Apparatus

Figure 2A:
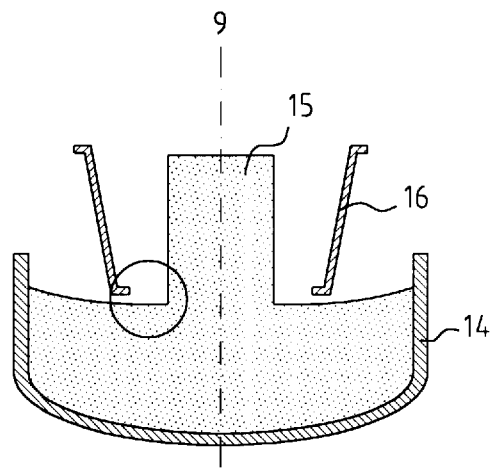
FIGS. 2(a) to 2(c) are diagrams for illustrating the condition of the surface of the melt in the vicinity of the crystal being pulled.

FIG. 1 is a block diagram for illustrating the principle underlying a melt level detection apparatus and detection method according to the present invention. As illustrated in FIG. 1, in the melt level detection apparatus according to the present invention, basically, a beam 2 emitted from a laser source 1 is projected onto a melt surface 3 at an angle θ, and the melt level 3 is calculated by the principle of triangulation based on the position of a measurement spot 31 obtained by the reflection thereof. The position of the measurement spot 31 is identified by condensing that regularly reflected beam 4 by a lens 5, and determining the position of convergence on a two-dimensional photosensor 7 (FIG. 1 (a)).

In this embodiment, the laser source 1 corresponds to the laser beam projector, while the lens 5 and the two-dimensional photosensor 7 corresponds to the photodetector. A beam attenuating filter 6 is disposed in front of the photodetector. The laser beam projector and photodetector are disposed at prescribed positions in the CZ furnace. In this embodiment, a distance measurement device 8 is configured by the laser beam projector (the laser source 1), the photodetector (the lens 5 and two-dimensional photosensor 7) and the beam attenuating filter 6. In the distance measurement device 8, within a virtual plane 12 that is roughly perpendicular to the radial directions of the crucible 14, the optical center axis 10 of the laser beam 2 and the optical center axis 11 of the photodetector unit are disposed (FIG. 1(c)). Also, provision is made so that the laser beam 2 scans over the melt surface along the radial directions of the crucible 14 within the range of an angle Φ (FIG. 1(d)). Thus the laser beam 2 will scan over the melt surface with a range that is the scanning range 13 (FIGS. 1(b) and 1(d)).

Basic Principle Underlying Melt Level Detection

Figure 2B:
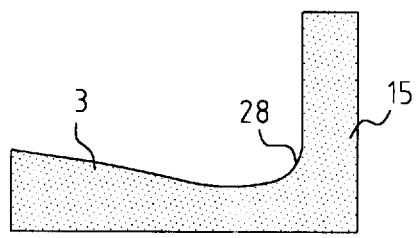
Figure 2C:
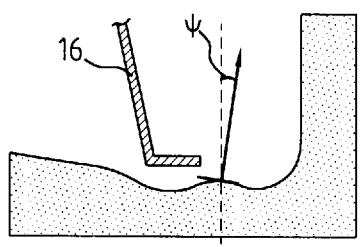

The meniscus 28 (FIG. 2(b)) that develops about the periphery of the crystal 15 being pulled (FIG. 2(b)), the parabolic inclination in the melt surface 3 generated by the rotation of the crystal being pulled (FIG. 2(b)), and the depression-shaped melt surface near the bottom portion of the heat shielding member 16 (FIG. 2(c)), respectively, exhibit profiles that are roughly symmetrical relative to the center of rotation 9 of the crucible. Since this coincides with the direction of the angular scan Φ of the laser beam 2, it follows that there will always exist, at one location inside the scanning range 13, a measurement spot 31, at which the angles will become roughly the same with the inclination of the melt surface 3 and the angle of incidence of the laser beam (FIG. 1(d)). Also, this measurement spot 31 is definitely caught by scanning within the scanning range 13 by the laser beam 2, and whenever the laser beam 2 is projected at the measurement spot 31, the regularly reflected laser beam 4 will always reach the photodetector.

Thus, in the present invention, by effecting a scan of only a slight distance in the radial directions of the crucible of the laser beam 2, the laser beam 2 can be made to regularly reflect to the photodetector without fail. Therefore, unlike in the conventional technology, there is no need to move the photodetector unit to coincide with inclinations in the melt surface. In this case, even if the pulling conditions change and the melt surface inclination profile change, a different measurement spot where the angles with the melt surface inclination Φ and the angle of incidence of the laser beam become roughly the same will newly appear within the scanning range 13. Therefore, the position of the photodetector unit need not be moved in this case either.

Based on such an apparatus configuration as this, even if the melt surface 3 changes to 3', all that will happen is that the measurement spot 31 will change to 31', in conjunction therewith the regularly reflected beam 4 will change to 4', and, finally, the position on the two-dimensional photosensor 7 where the regularly reflected beam is projected will be different. Therefore, even when a minute surface change has occurred, there is no need to alter the positions of the laser beam projector and photodetector, and, in this case also, the positions of the laser beam projector and the photodetector unit need not be moved.

Scanning

In the present invention, as will be described subsequently, by providing a two-dimensional photosensor in the photodetector (i.e. the lens 5 and the two-dimensional photosensor 7) for simultaneously detecting the two-dimensional position of a measurement spot on an observation surface, it becomes possible to detect the two-dimensional position of the measurement spot on the heat shielding member and on the melt level, and, when such as that is done, it becomes possible also to simultaneously measure the distances between the melt level and the heat shielding member 16.

Figure 3:
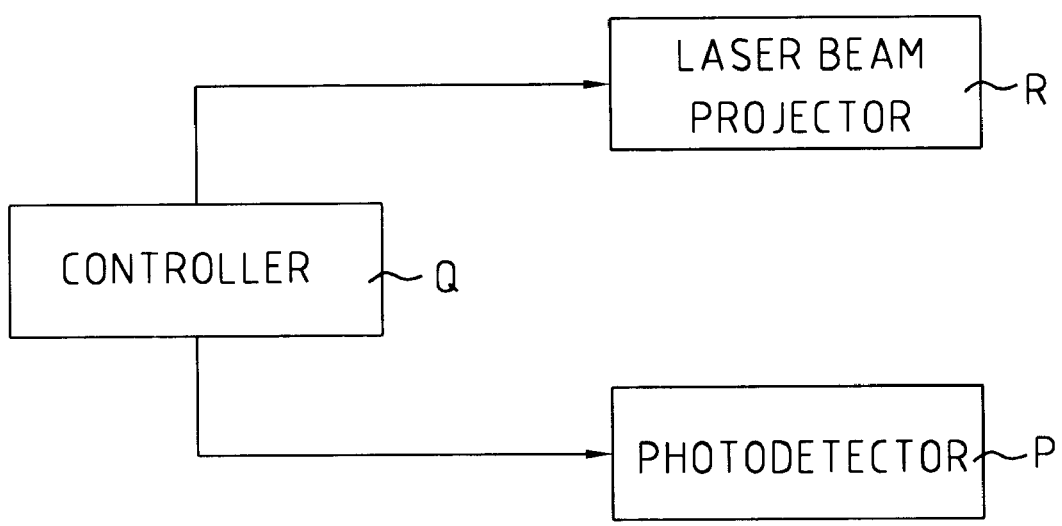
FIG. 3 is a diagram for illustrating scanning according to one embodiment of the present invention.

Moreover, the scanning in this embodiment, as illustrated in FIG. 3, is performed by having a controller Q perform feedback control on the laser beam projector R based on input information from the photodetector P. The scanning done to detect the level of a surface in a CZ furnace based on the principle of scan triangulation may be done either at regular times or occasionally as necessary.

Figure 4:
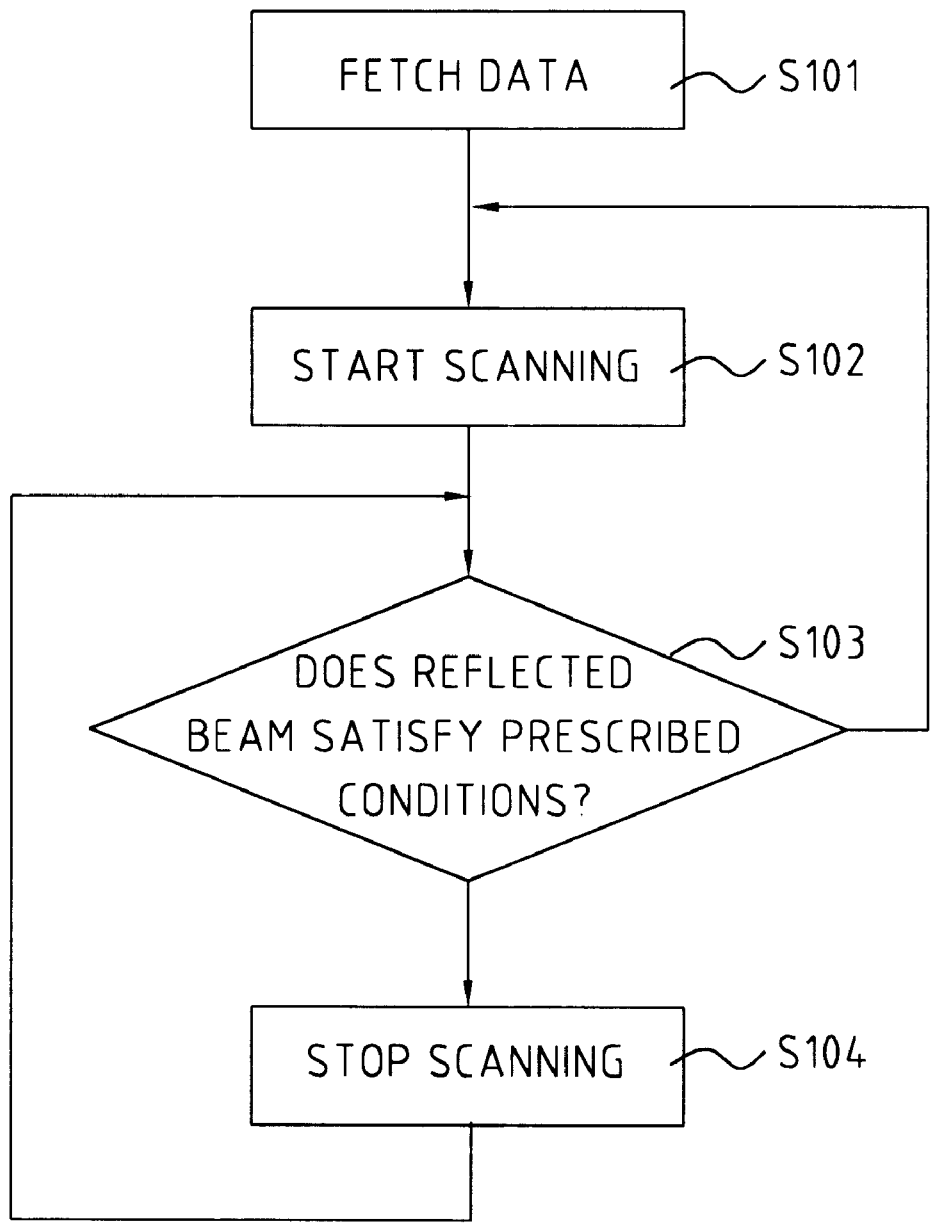
FIG. 4 is a flowchart for illustrating the operation of scanning according to one embodiment of the present invention.

FIG. 4 is a flowchart for illustrating a scanning operation according to an embodiment in a case where the scanning performed primarily by the controller Q is performed occasionally, as necessary. As illustrated in FIG. 4, first, after data have been fetched (S101), scanning is executed (S102). Then, while the scanning is being executed, a determination is made as to whether or not the reflected beam satisfies the prescribed conditions (S103). When those conditions are satisfied, scanning is terminated, and measurement is effected at that location (S104). When, on the other hand, the reflected beam has not satisfied the prescribed conditions, operation is returned to S102 and scanning is continued. Also, even when scanning has been stopped, if the prescribed conditions cease being satisfied by the reflected beam due to a subsequent change in the situation, scanning is recommended, following the path S104→S103→S102, and the search is continued until the reflected beam again satisfies the prescribed conditions.

What is called the "prescribed conditions" that the reflected beam described above should satisfy is, for example, the strength or form of the light reception signal. Those may be judged by the value of the integral of several peak values for the signal each iteration, and they may be judged by the number of successes per measurement iteration or unit time. Provision may also be made so that, in terms of the way cases where the light receiving conditions have deteriorated are handled, instead of simply automatically suspending measurement and automatically resuming scanning, an alarm is issued to call an operator, and, by the judgment of that operator, scanning is resumed and searching and setting are performed again.

Modification Examples
<Mirror and Prism Installation>

Figure 5:
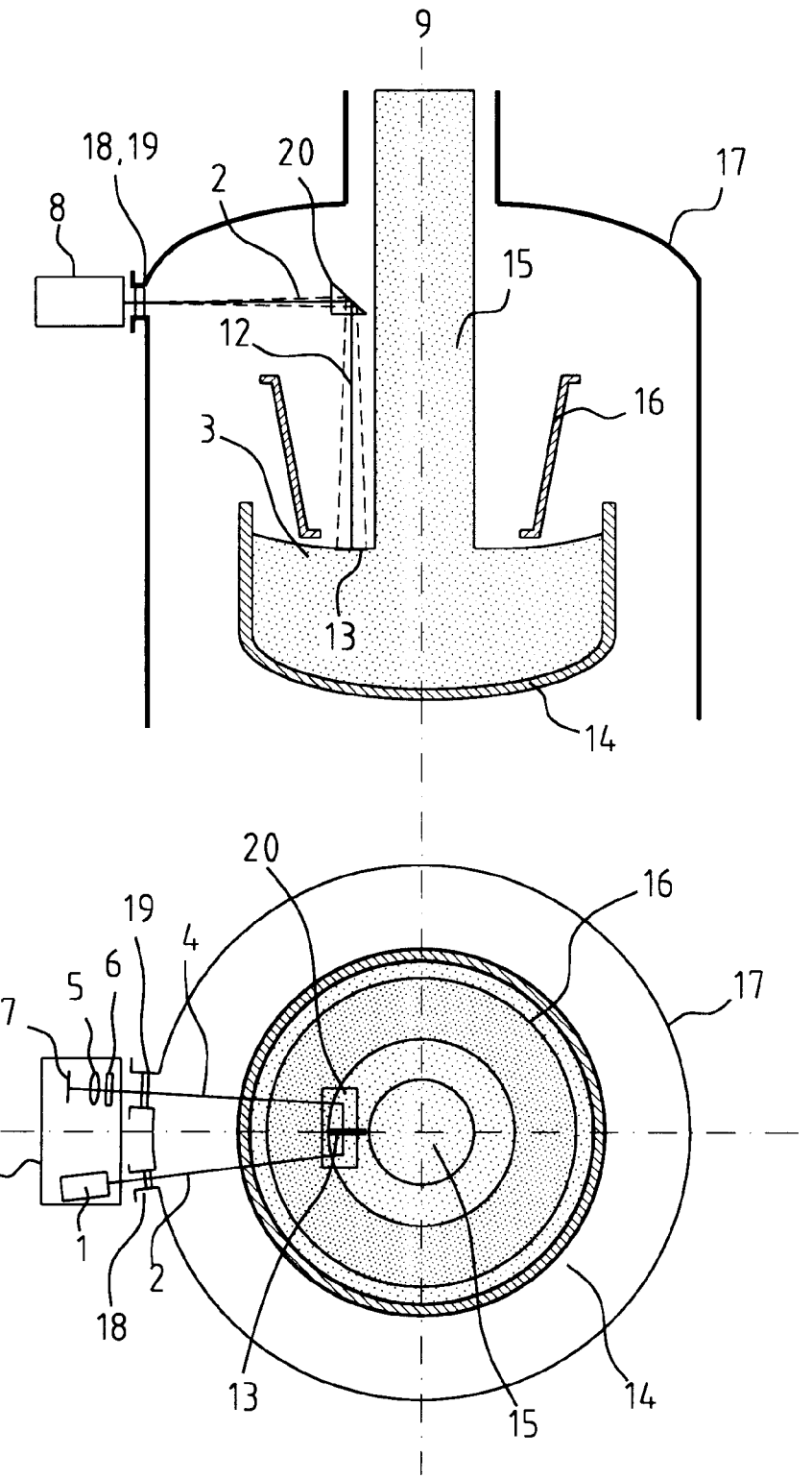
FIG. 5 is a block diagram illustrating one embodiment wherein light path alteration means are employed.
Figure 6:
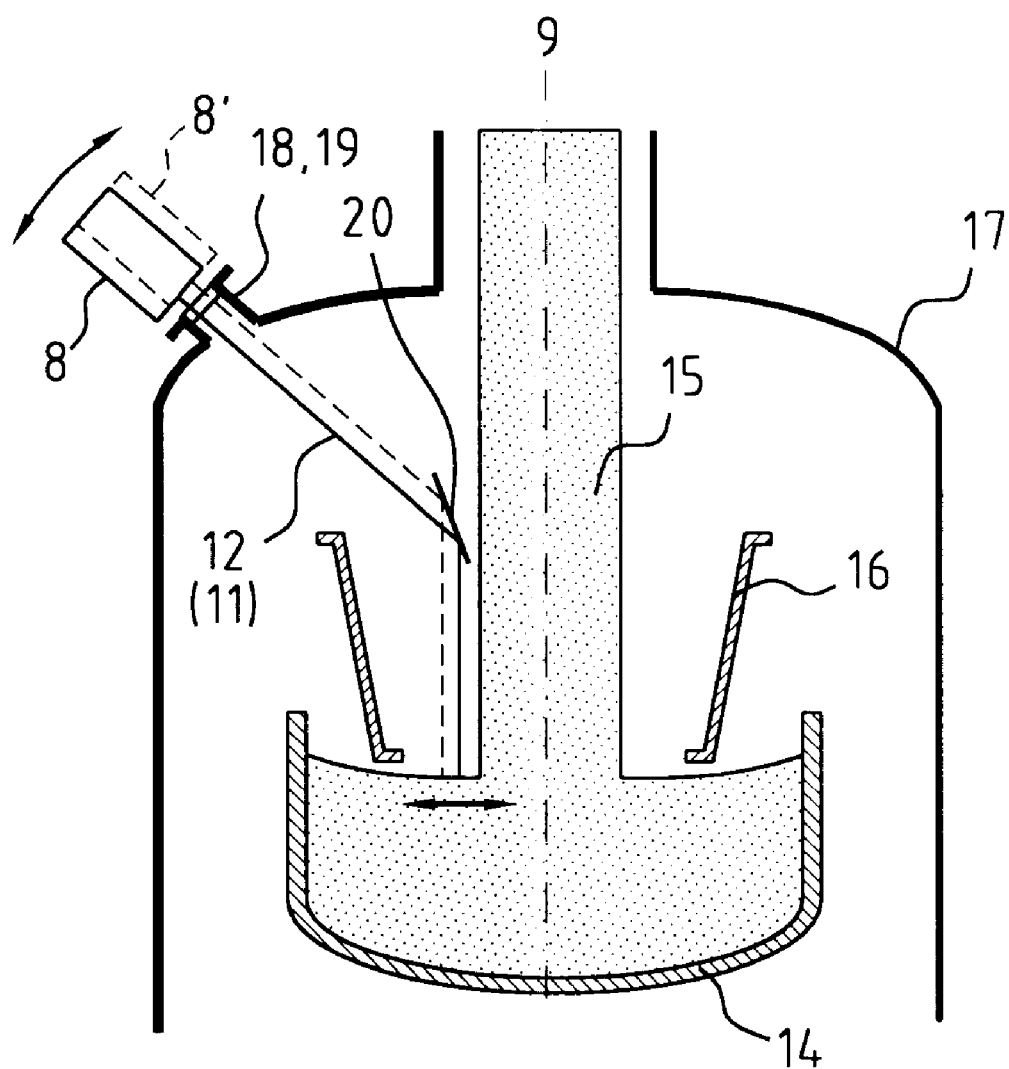
FIG. 6 is a block diagram illustrating another embodiment wherein light path alteration means are employed.

As illustrated in FIG. 5 and 6, the laser beam emitted from the laser source 1 can be projected onto the melt surface 3 through light path alteration means 20 such as a mirror or prism. The light path alteration means 20 such as a mirror or prism should ideally be disposed between the heat shielding member 16 and the crystal 15. By doing in that way, even in cases where the gap between the heat shielding member 16 and the crystal 15 is extremely narrow, the laser beam can be projected against, and caused to be reflected from, the portion in that extremely narrow gap. Further, by bending and altering the light path, mechanical interference with the distance measurement device 8 and the crystal 15, or with the housing 17 of the straight trunk part of the crystal, can be avoided, and the degree of design freedom improved.

Figure 7:
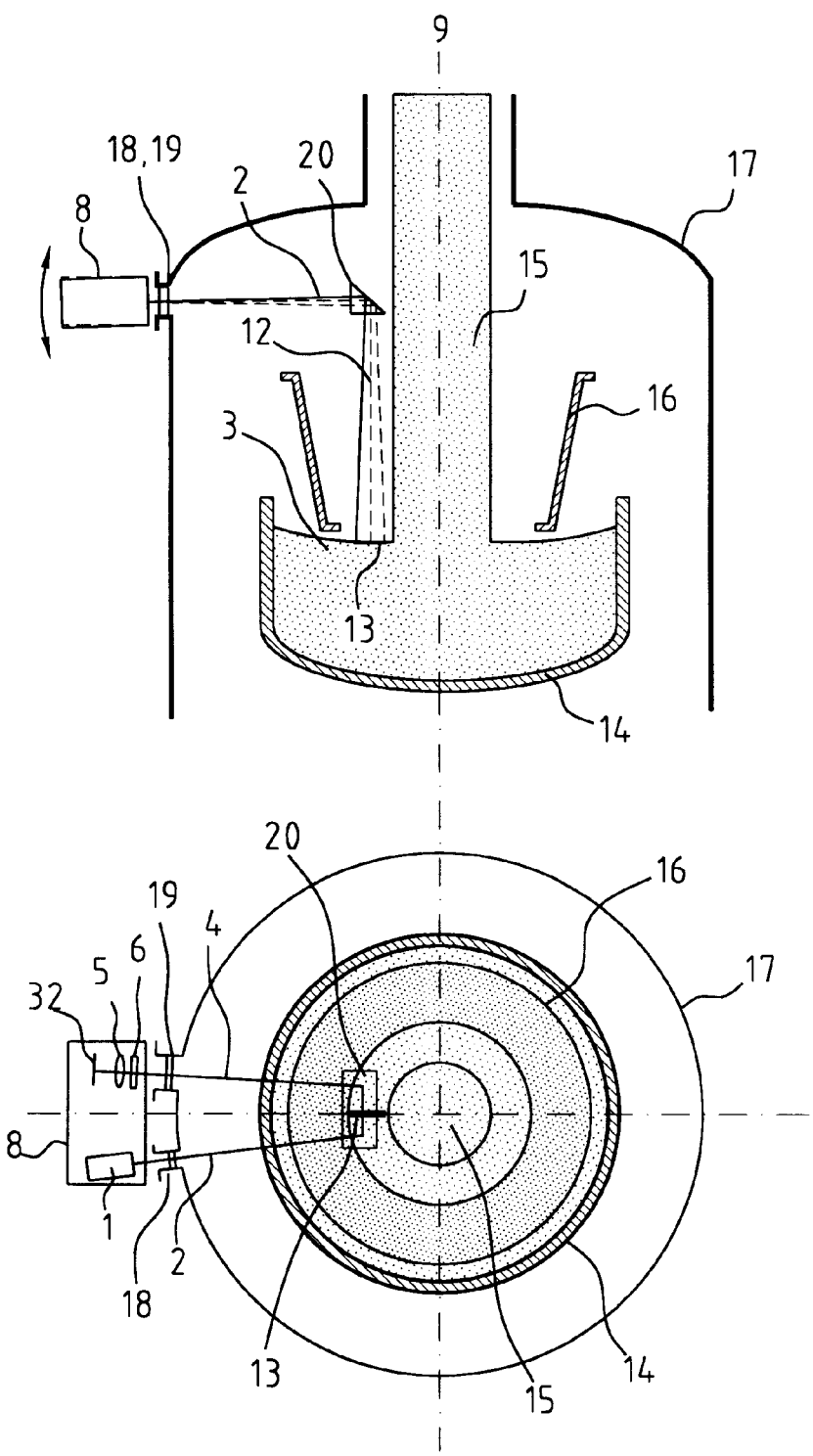
FIG. 7 is a block diagram illustrating yet another embodiment wherein light path alteration means are employed.

When the light path alteration means 20 are used, provision may also be made so that, as illustrated in FIG. 7, the measurement device 8 is rotated. That is, when a triangulation measurement device unit having a narrow measurement angle (5° to 3°) is used, the measurement device itself is rotated so that the entirety of the scanning range 13 is scanned while making up for the narrow measurement angle, whereby effective distance measurement can be performed. Alternatively, provision is made to rotate not the distance measurement device 8 itself but rather the light path alteration means 20.

Figure 8:
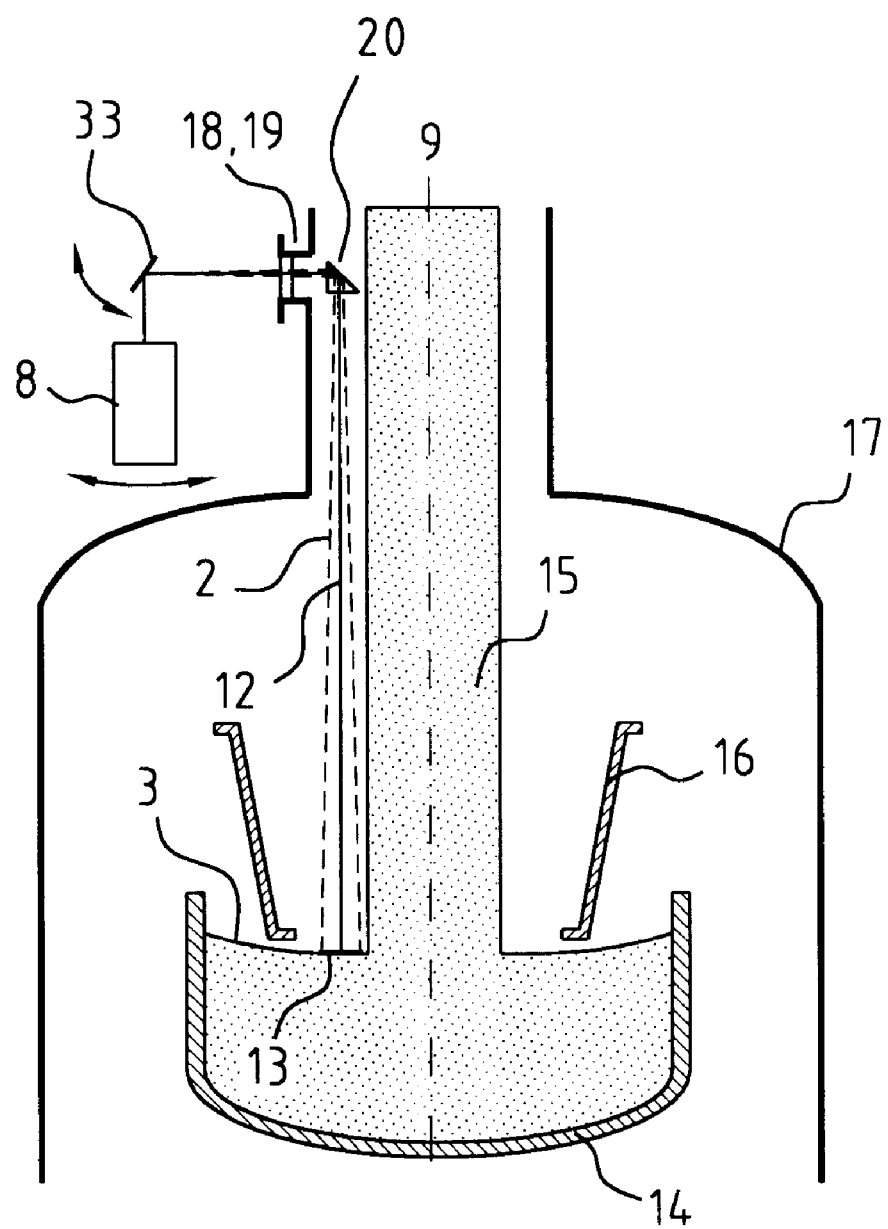
FIG. 8 is a block diagram illustrating still another embodiment wherein light path alteration means are employed.
Figure 9:
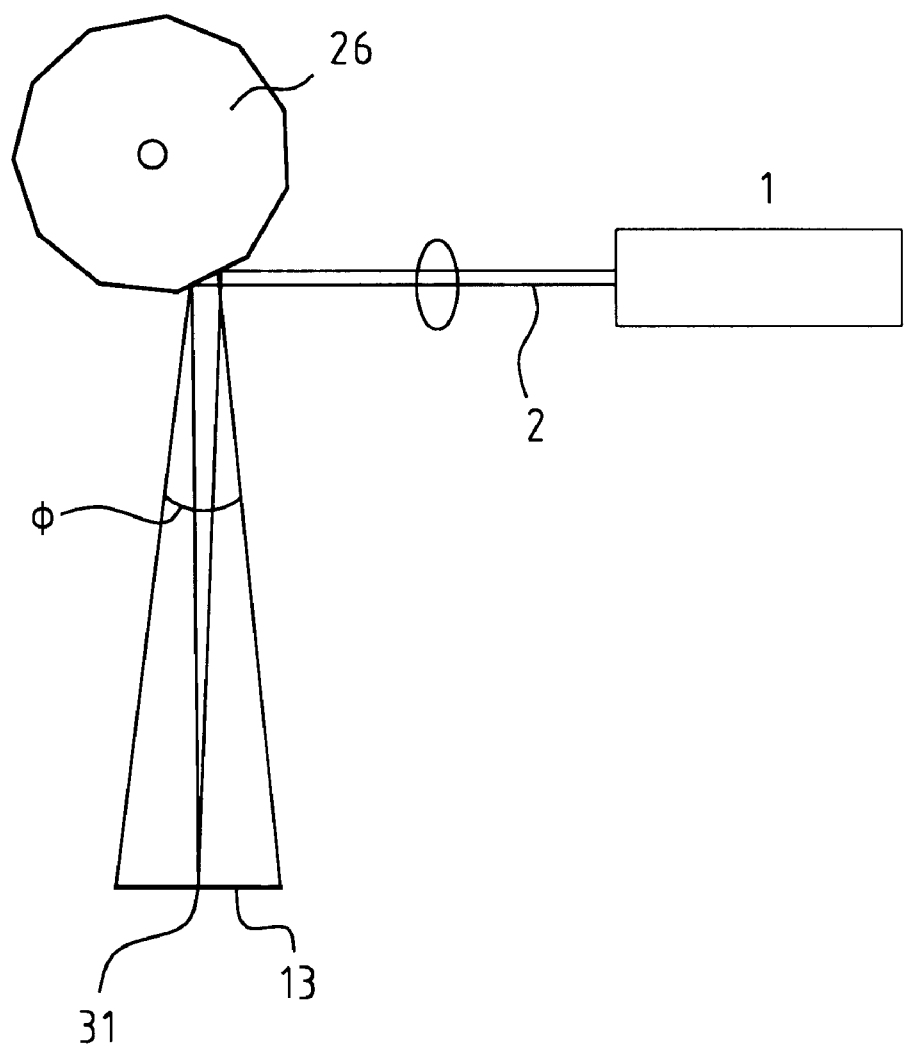
FIG. 9 is a block diagram illustrating an embodiment in a case where scanning is done using a polygon mirror.

Further, provision may be made for disposing two more light path alteration means. In that case, the two or more light path alteration means may be of the same type or of different types. In FIG. 8 is illustrated an example wherein two types of light path alteration means, namely a mirror and a prism, are disposed in series. In the embodiment illustrated in FIG. 8, by rotating a rotating mirror 33, like function and effectiveness as in the embodiment illustrated in FIG. 7 can be obtained. The shape of the light path alteration means is not particularly limited, and, in the case of a mirror, that may be flat, or a polygon mirror 26 indicated in FIG. 9, for example, can be used.

<Light Projection Optimization>

By causing the distance measurement device 8 to move perpendicularly to the optical center axis 11 of the photodetector unit and along the laser beam scanning direction, as illustrated in FIG. 6 (position of the broken line; moving stage, etc. not shown), the measurement position for the melt surface 3 between the crystal 15 and the heat shielding member 16 can be adjusted without changing the relative position of the melt surface 3 and the distance measurement device 8. By so providing, it becomes possible to search out optimal conditions where the inclination of the melt surface 3 and the angle of incidence of the laser beam better coincide.

Figure 10:
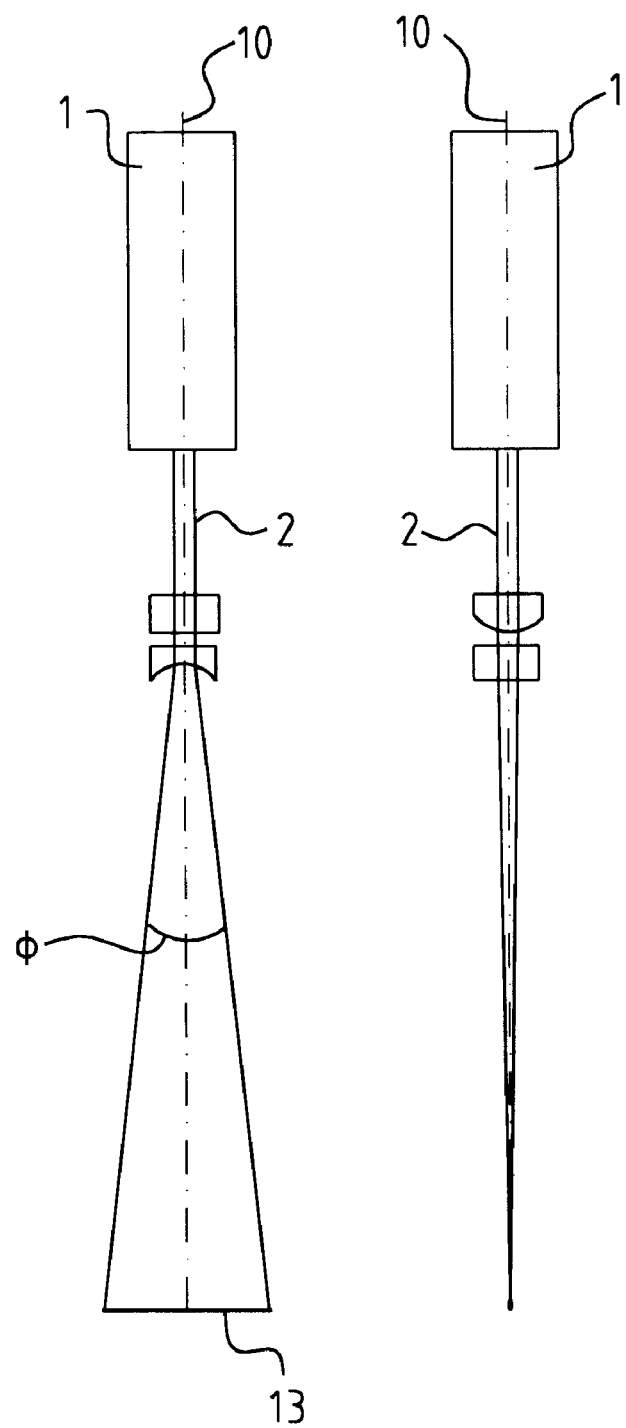
FIG. 10 is a diagram for illustrating an embodiment in a case where scanning is done which broadens the laser beam.
Figure 11:
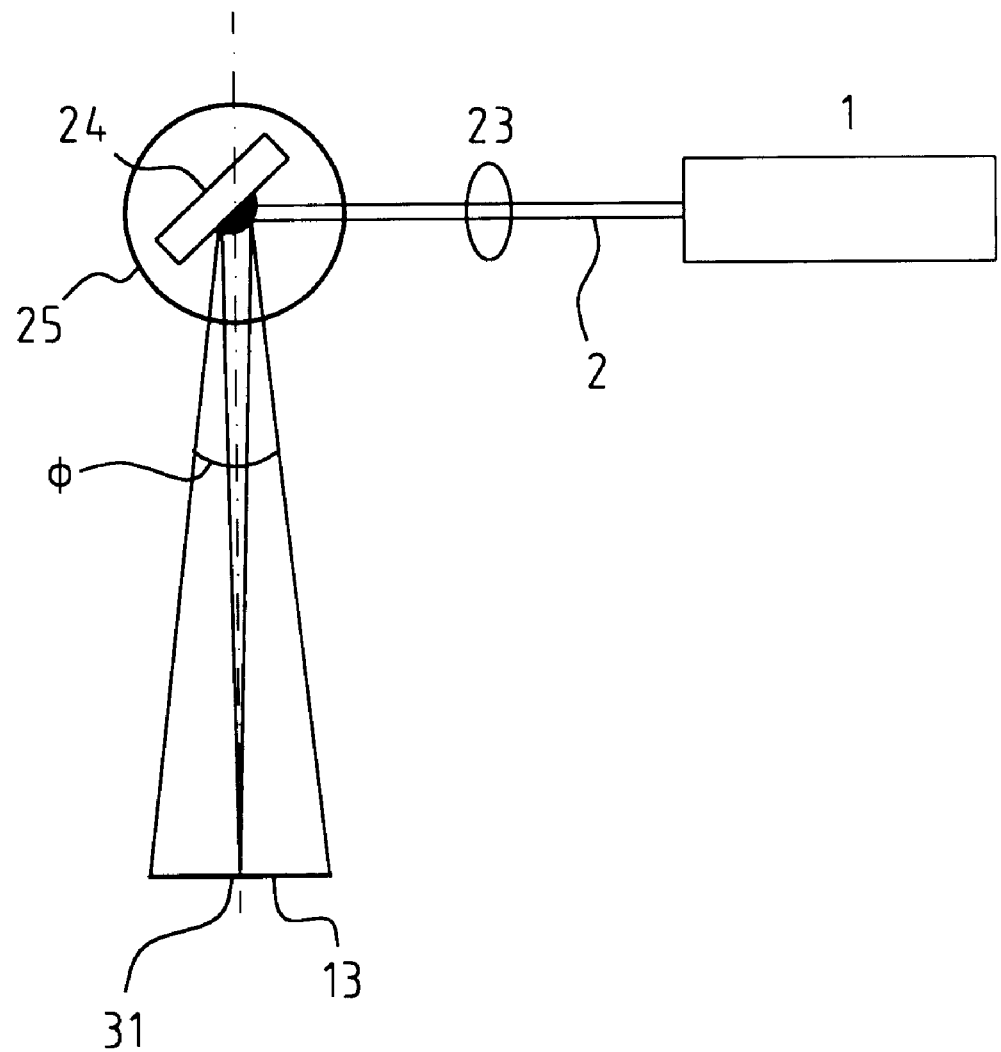
FIG. 11 is a diagram for illustrating an embodiment in a case where scanning is done by rotating a mirror.

Provision may also be made so that, as illustrated in FIG. 10 and 11, the laser beam is made to be reflected by the mirror to enlarge the laser beam in one direction so as to form a slit light, and light is projected over the range of the angle Φ all at one time with the slit light. Scanning by varying the angle of the mirror can be done easily by driving a motor 25 that is integrated with the mirror 24 as illustrated in FIG. 11. Provision may also be made so that, for the lens 5 in the photodetector unit of the distance measurement device 8, a lens having a size (aperture) (φ 50 mm, for example) large enough to effectively the quivering in the regularly reflected laser beam 4 induced by minute ripples in the melt surface 3 is employed, so that stable melt level measurements can be made in the face of minute ripples in the melt surface 3.

For the prism disposed inside the furnace, quartz (fused silica) may preferably be used in the interest both of preventing contamination inside the furnace and of stability against high temperatures. In cases where the radiation from the melt surface is strong, it is desirable to provide a water cooling jacket for the metal flange attaching the prism. Also, it is desirable that the mirror disposed inside the furnace is of polished silicon in the interest of preventing contamination inside the furnace. In cases where the radiation from the melt surface is strong, it is desirable to provide a water cooling jacket for the metal flange attaching the silicon mirror.

Making Triangulation Angle Variable

Figure 12:
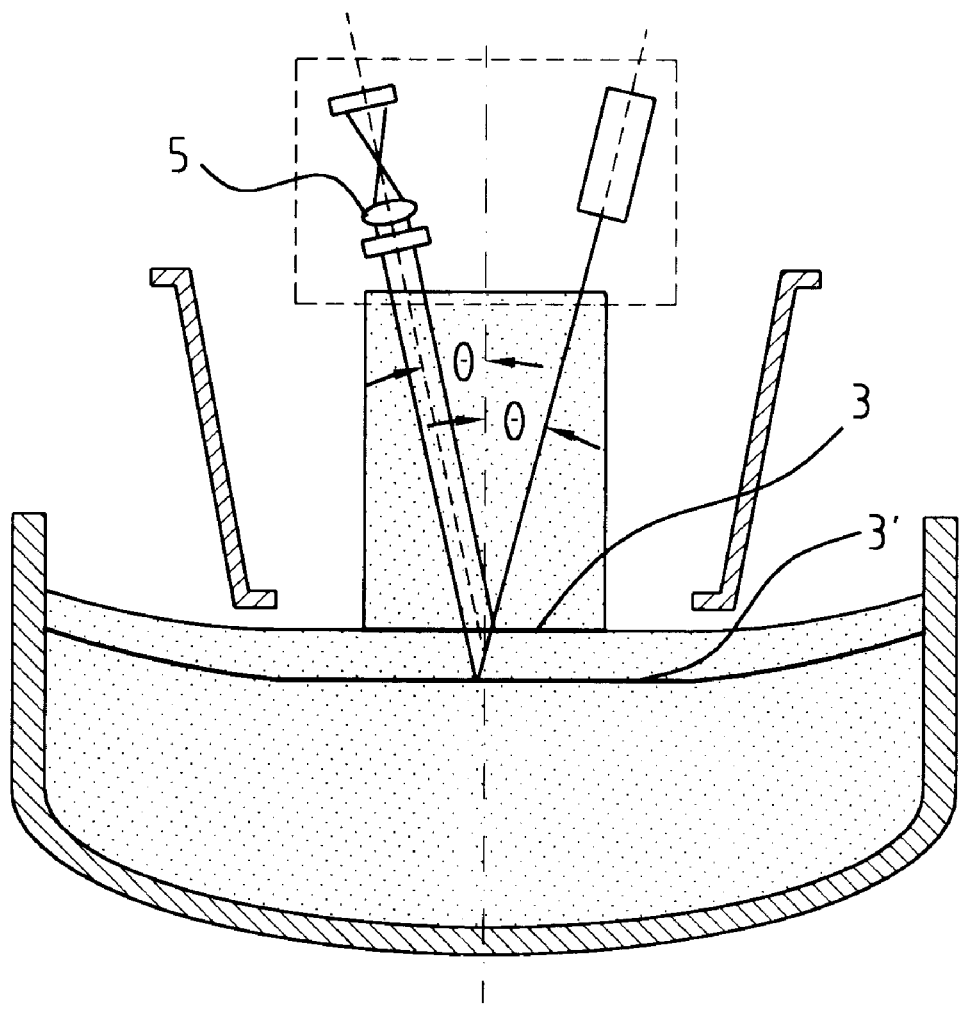
FIG. 12 is a block diagram illustrating an embodiment wherein, by setting the angle of incidence of the beam small, the interval between displacements in the surface that is the object of detection is made wider.

As illustrated in FIG. 12, by setting the angle of incidence of the beam small (5° to 3°), the interval between the displacements (3 to 3') of the surface that is the object of detection, can be made wider, so that the reflected beam can be received and measured over a broader range. In that case, as will be exemplified below, by making it possible to appropriately alter the angle of incidence of the beam, it becomes possible to alter, as necessary, the displacement in the surface that is the object of detection.

Figure 13:
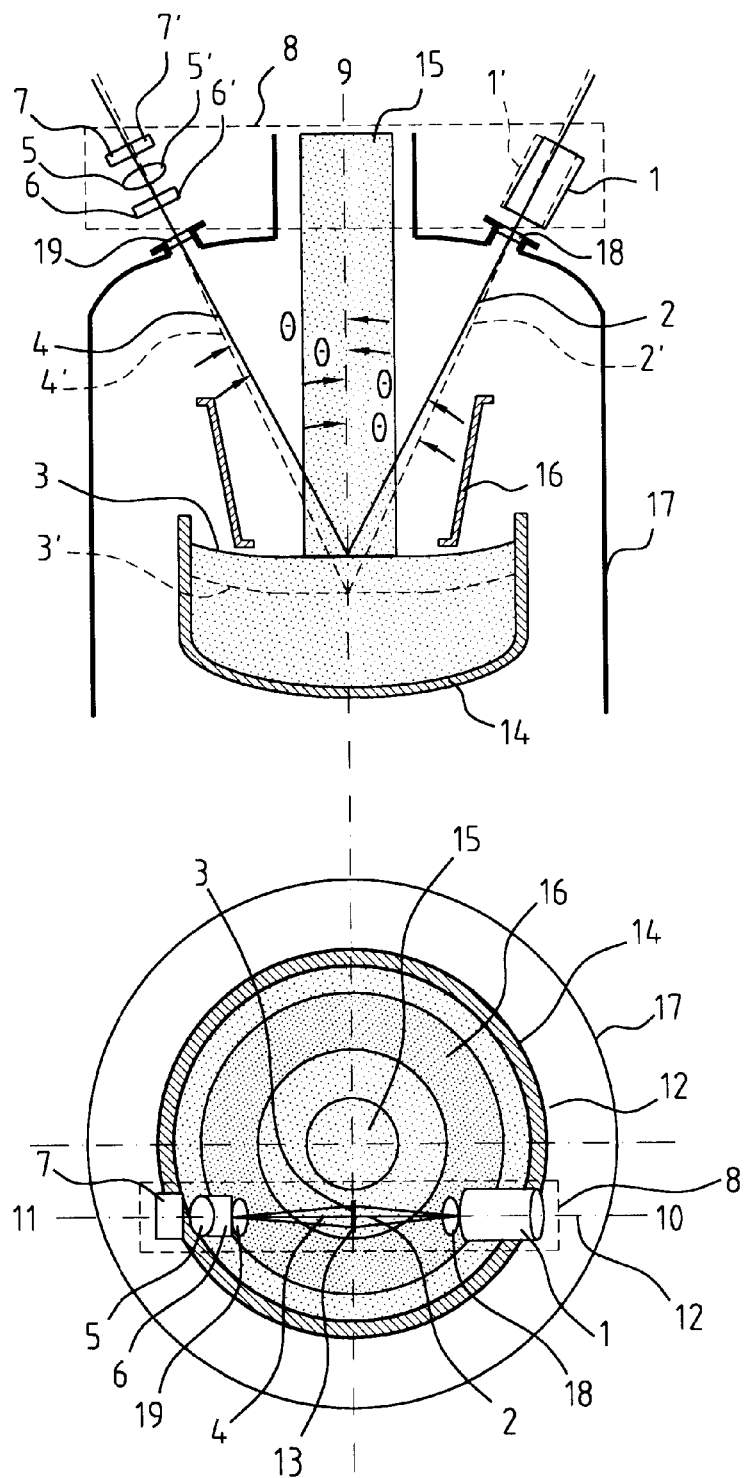
FIG. 13 is a block diagram illustrating an embodiment wherein the laser source and the photodetector unit are rotated in order to widen the interval between displacements in the surface that is the object of detection.

First, by rotating the laser source 1 and the photodetector system (5, 6, and 7) so that the projection angle θ of the laser beam 2 and the optical axis θ of the photodetector system both become the same, as illustrated in FIG. 13, measurement can be performed through a small projection window 18 and observation window 19 in the face of large changes in the melt surface 3 (3 to 3'). The melt surface 3 can be found from θ at the time when the regularly reflected beam 4 forms a spot at a reference position on the two-dimensional photosensor 7. The melt surface 3 can also be found by measuring how far the regularly reflected beam 4 is shifted relative to the reference position on the two-dimensional photosensor 7 at some θ.

Figure 14:
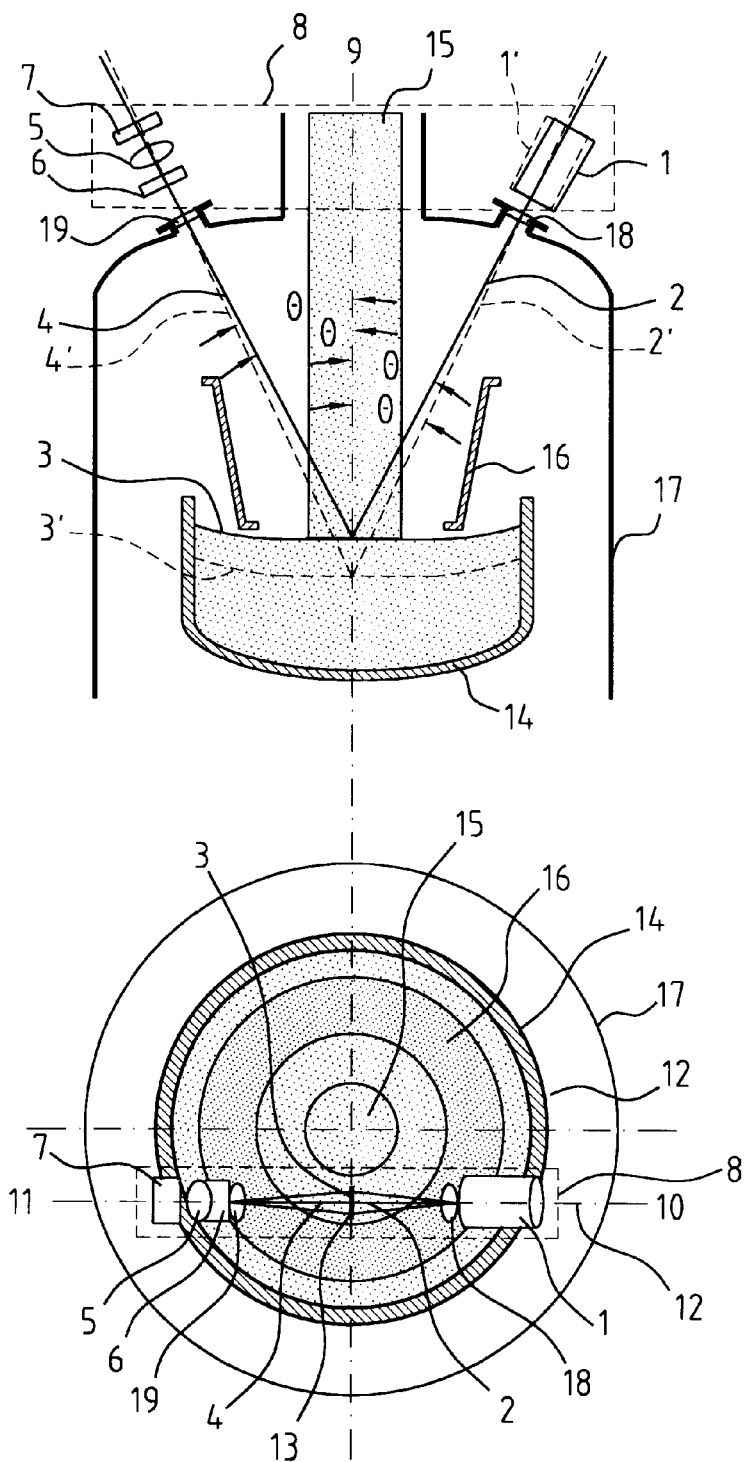
FIG. 14 is a block diagram illustrating an embodiment wherein the laser source is rotated in order to widen the interval between displacements in the surface that is the object of detection.

On the other hand, as illustrated in FIG. 14, by rotating the laser source 1 so that the projection angle θ varies, measurement can be performed through the small projection window 18 and the observation window 19 in the face of large changes in the melt surface 3 (3 to 3'). By determining the relationship between the melt surface 3 and the position where the spot from the regularly reflected beam 4 is formed on the two-dimensional photosensor 7 for each projection angle θ beforehand, the melt surface 3 can be found. The projection window 18 and observation window 19 may also be a common large window. Furthermore, when the radiation from the melt surface is strong, it is preferable to apply a coating (such as a coating of gold) to the window material in order to block infrared radiation, and also to provide a water cooling jacket for the metal flange attaching the window or windows.

Beam Attenuating Filter Installation

Figure 15A:
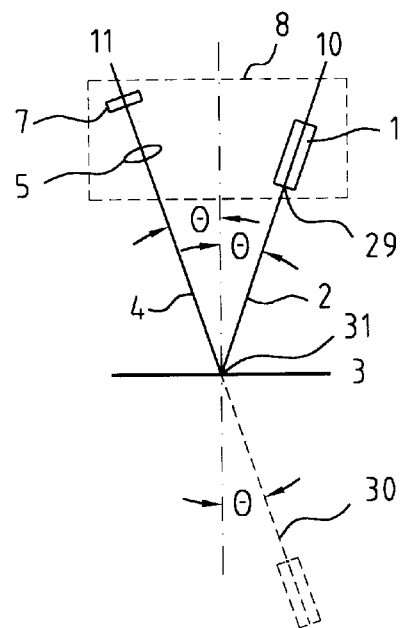
FIGS. 15a–15b is a diagram for illustrating the elimination of a ghost.
Figure 15B:
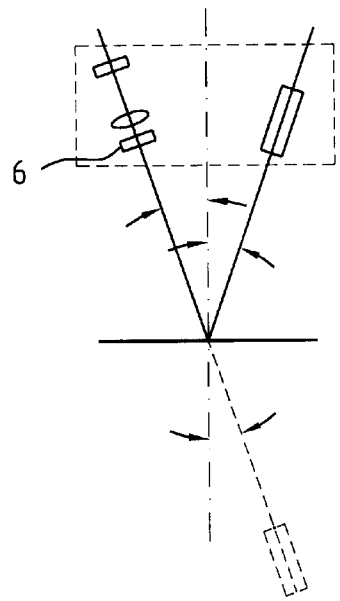

By making the intensity of the laser beam 2 sufficiently strong, and also inserting a beam attenuating filter 6 in the photodetector unit (FIG. 15(b)), saturation of the received light strength on the two-dimensional photosensor 7 due to the regularly reflected beam 4 can be prevented. At the same time, by sufficiently attenuating the intensity of the scattered laser light at the laser beam emission port 29 which is reflected back by the melt surface 3 (mirror surface), spot formation on the two-dimensional photosensor 7 (pick up at the emission port) can be prevented, making it possible to substantially prevent measurement error. Accordingly, by inserting such a beam attenuating filter, it also becomes possible to detect the melt level in a condition such that the radiant light noise from the melt surface 3 is blocked and the measurement spot 31 is formed with good contrast on the two-dimensional photosensor.

Thermal Shield Position Detection

Figure 16:
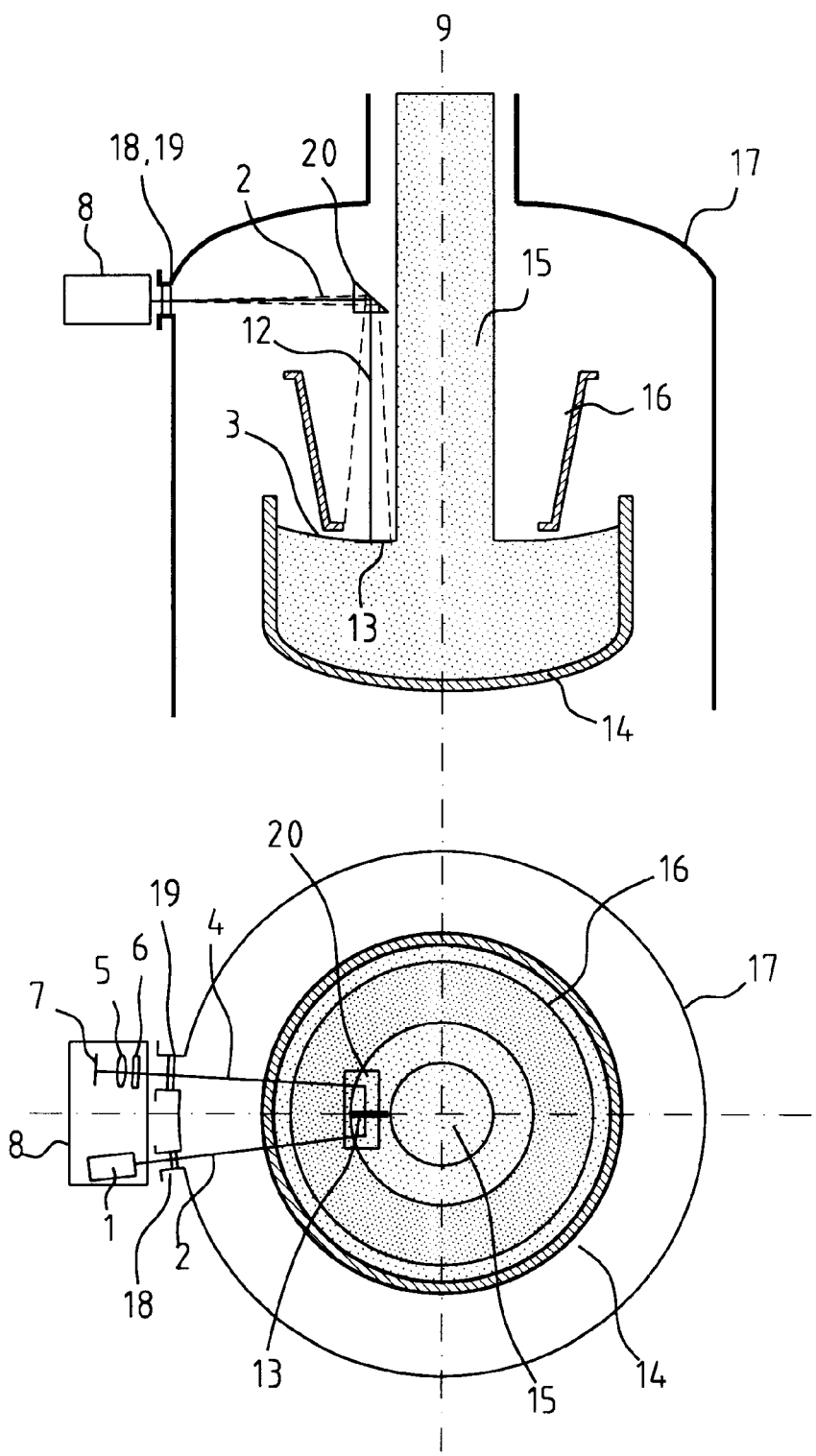
FIG. 16 is a block diagram illustrating an embodiment wherein a heat shielding member is detected.

FIG. 16 is a diagram illustrating the case in which the scanning range 13 in the embodiment illustrated in FIG. 5 is expanded to the heat shielding member 16. By making the scanning range 13 of the laser beam 2 a range that covers both the melt surface 3 and the heat shielding member 16 in this manner, it becomes possible to measure the relative distance between the melt surface 3 and the heat shielding member 16. The melt surface 3 and heat shielding member 16 are distinguished from each other by the difference in their reflectivity.

The reason that, with such a configuration as described above, even positions in the lateral direction of the heat shielding member can be detected in the present invention, contrary to the invention disclosed in Japanese Patent Publication (Kokoku) No. 3-17084, is not because an average value is taken in some area, but basically because scanning is performed in spot fashion. That is in the present invention, although in terms of results scanning is performed linearly, what moves linearly is nothing more than the measurement spot, and no average of data obtained by performing the scanning is taken. Therefore, the reflectivity in the lateral direction will be detected for each measurement spot, and, as a consequence, it will be possible to detect even the position of the heat shielding member in the lateral direction.

In the present invention, furthermore, by making innovative provision for installing a beam attenuating filter, it has become possible to directly measure positions in the height dimension of the heat shielding member, merely by verifying the measurement position with an image sensor, without making special provision of a reflecting body as a reference point at the lower extremity of the heat shielding member. Similarly, in the cases of the embodiments illustrated in FIG. 1, 7, 8, 13, and 14, by expanding the scanning range 13 to the heat shielding member 16, it becomes possible to measure the distance between the melt level and the heat shielding member directly.

Figure 17:
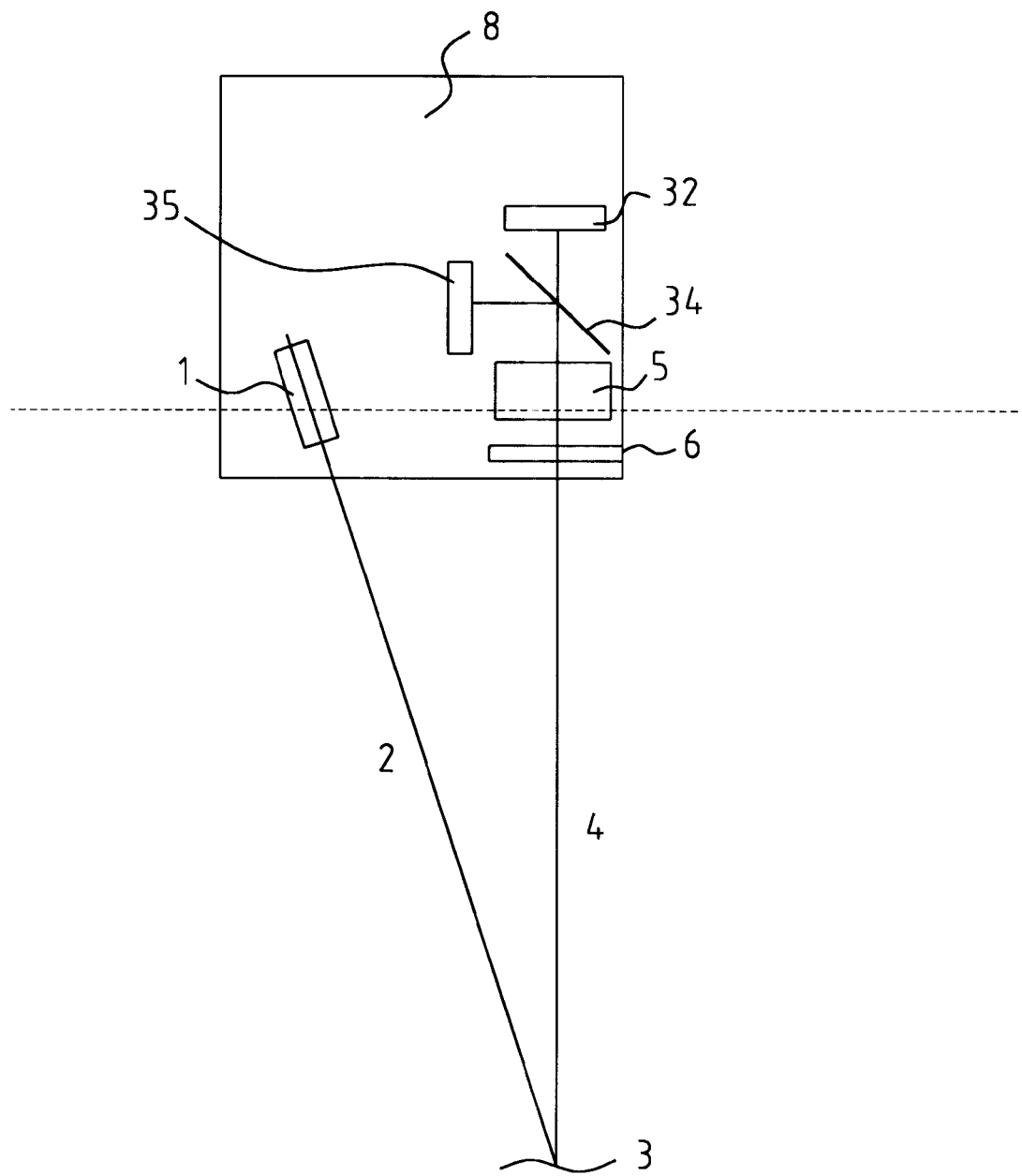
FIG. 17 is a block diagram of the configuration of a very suitable measurement unit in an embodiment wherein the heat shielding member is detected.

Incidentally, in cases where the distance between the melt level and the heat shielding member is measured as in this embodiment, it is preferable that, in order to detect also the position in the lateral direction of the heat shielding member, a beam splitter 34 and two-dimensional photosensor 35 be disposed in the photodetector unit as illustrated in FIG. 17, so that the image of the measurement spot 31 can be verified. In such a measurement unit 8 as this, a two-dimensional photosensor 35 is disposed in a conjugate position with a one-dimensional photosensor 32, the light that passes in through the lens 5 and the beam attenuating filter 6 is split by the beam splitter 34, and the melt level is detected by the one-dimensional photosensor 32 while the range of the heat shielding member 16 is detected by the two-dimensional photosensor 35.

Figure 18:
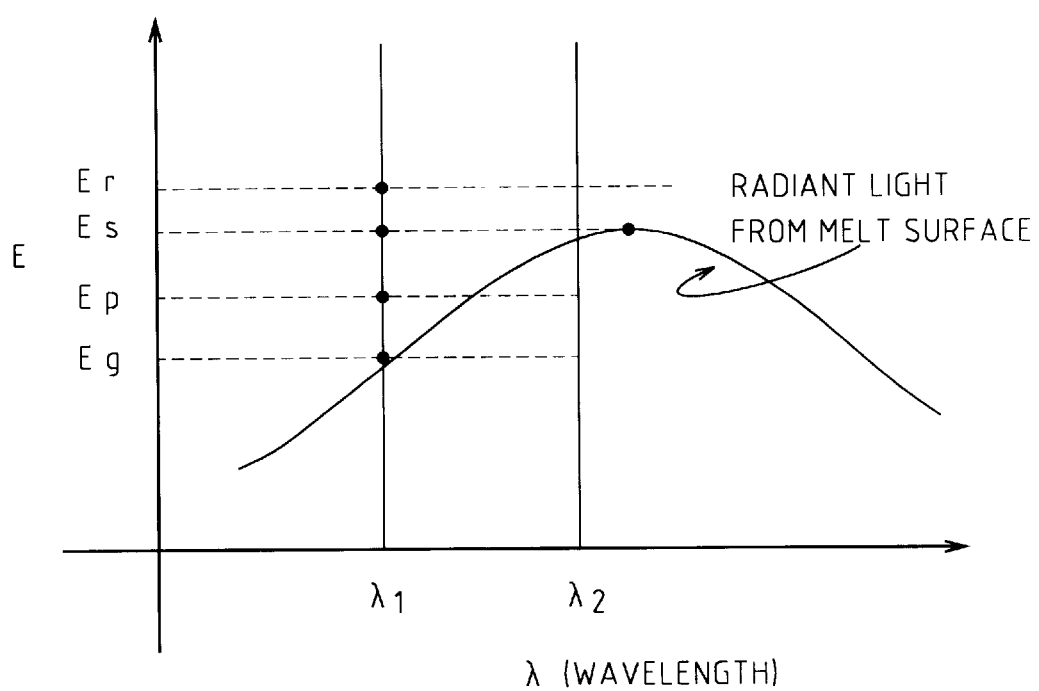
FIG. 18 is a diagram for illustrating the principle whereby ghosts are eliminated and a melt level is detected, and the principle whereby a heat shielding member is detected.
Figure 19:
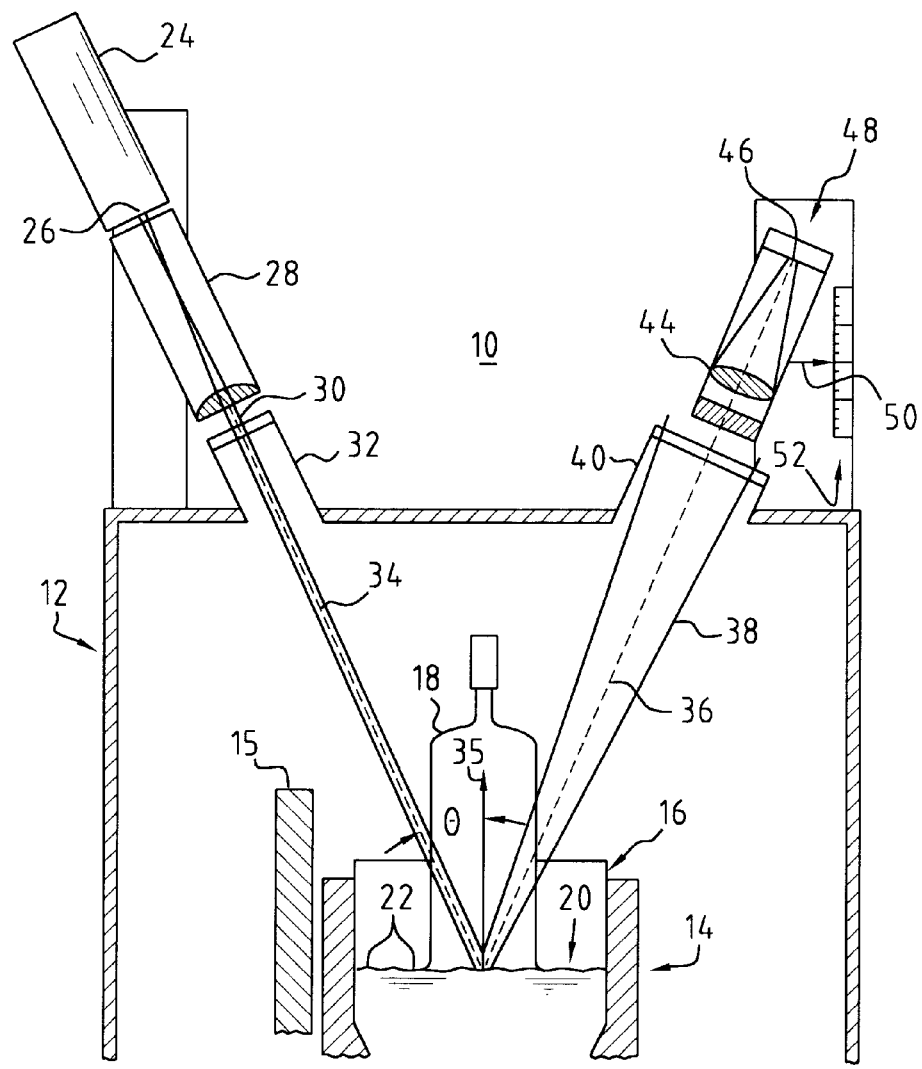
FIG. 19 illustrates the configuration of a conventional melt level detection.
Figure 20:
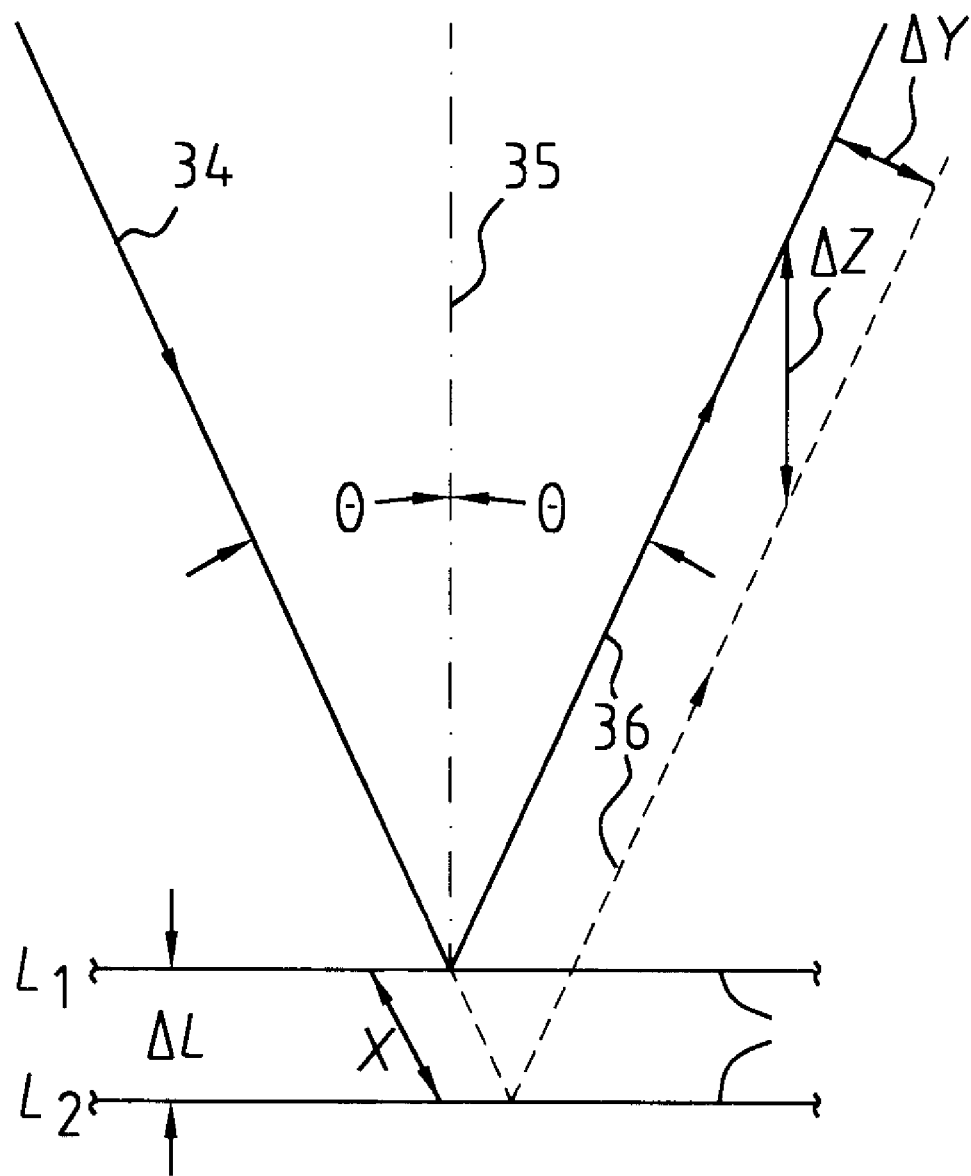
FIG. 20 illustrates the configuration of the conventional melt level detection apparatus.

The relationship between the laser beam intensity and the beam attenuating filter is now explained. First, FIG. 18 is a diagram that illustrates the relationship between light wavelength and energy. In FIG. 18, Ep connotes the energy level blocked by the beam attenuating filter, Eg the energy level of the ghost, Er the energy level of the laser beam, and Es the highest energy level of the light radiated from the surface of the melt. As is clear from FIG. 18, Er has to be larger than Eg, and Ep has to be positioned between Er and Eg. In the case of wavelength λ1, in particular, because Ep is larger than the energy of the radiant light from the surface of the melt, it becomes possible to block also the radiant light from the surface of the melt with the beam attenuating filter. On the other hand, however, in the case of wavelength λ2, because the energy of the radiant light from the surface of the melt is larger, the radiant light from the surface of the melt will show up in the background even when a beam attenuating filter is used. In this case, moreover, the portion for the heat shielding member will show up as a shadow.

More specifically, in a preferred embodiment, when a 2.5 mW laser beam and a 1/1000 beam attenuating filter are combined, the radiant light from the surface of the melt will show up in the background. When a 5 mW laser beam and a 1/10,000 beam attenuating filter are combined, a regularly reflected beam from which the ghost has been removed will be obtained. A reflected beam will be obtained from a heat shielding member made of carbon with the combination of a 15 mW laser beam and a 1/10,000 beam attenuating filter.

Furthermore, in any of the embodiments described above, provision may be made so that, in terms of optical filters, a band-pass filter is used Φ together with a beam attenuating filter. For the one-dimensional photosensor 32, a linear CCD or PSD or the like is preferable, while for the two-dimensional photosensor 7, an area-type CCD or PSD or the like is preferable. In this connection, in the last-described embodiment, although it is clear that the combination of a beam attenuating filter and band-pass filter is effective, when a CCD is employed, that CCD itself will serve as a band-pass filter. Therefore, that will be taken into consideration when selecting a band-pass filter.

In the embodiments relating to FIGS. 1, 5, 6, 7, 8, 13, and 14, furthermore, the laser source 1, beam attenuating filter 6, light receiving lens 5, and photosensor 7 or 32 configuring the measurement device 8 should be disposed either in the same housing or on the same board.

INDUSTRIAL APPLICABILITY

According to the present invention, provision is made for scanning is performed with the laser projection angle within an extremely small range, finding a suitable location for detecting the melt level, and making a measurement in that portion. Therefore, the melt level can be detected without inviting apparatus complexity, and in a condition wherein there is little influence of noise produced at the surface of the melt.

Accordingly, based on the present invention, it becomes possible to accurately detect melt levels with a configuration that is simpler than conventional apparatuses.

What is claimed is:

1. A melt level detection method for detecting a level of a surface of a melt inside a CZ furnace by using a laser beam projector and photodetector disposed at prescribed positions in a CZ furnace, based on principle of triangulation, wherein a position at which the laser beam projector projects is moved in radial directions of a crucible inside the CZ furnace, whereby the laser beam reflected from the surface of the melt scans a projection position at which the laser beam is received by the photodetector, and projection position of the laser beam is set at the position; and the projection position of the laser beam is set at that position.

2. The method according to claim 1, wherein a beam attenuating filter which blocks light of lower light intensity than light of the laser beam emitted from the laser beam projector and regularly reflected from the surface of the melt is provided to eliminate ghosts other than the regularly reflected beam.

3. The method according to claim 1, wherein the scanning is performed up to a bottom portion of a heat shielding member disposed inside the CZ furnace, and portions of the heat shielding member is detected by difference in reflectivity between the bottom portion of the heat shielding member and the surface of the melt.

4. The method according to claim 1, wherein the photodetector comprises a two-dimensional photosensor which simultaneously detects two-dimensional positions of measurement spots on an observation surface, and the melt level and two-dimensional positions of measurement spots on the heat shielding member are detected.

5. The method according to claim 1, wherein the scanning for detecting the level of the surface of the melt inside the CZ furnace based on the principle of triangulation is either performed at regular times or occasionally.

6. The method according to claim 5, wherein the scanning performed occasionally is for finding a position where reflected beam receiving conditions are favorable, the scanning being stopped while the light receiving conditions are favorable, the scanning being resumed when light receiving conditions deteriorate and search is continued until a position is reached where reflected beam receiving conditions are favorable.

7. In a method of detecting a level of a liquid surface by emitting a laser beam from a prescribed position relative to the liquid surface whose level is to be detected, and receiving the laser beam reflected from the liquid surface whose level is to be detected, at a prescribed position different from the first-mentioned prescribed position whereby the level of the liquid surface is detected based on principle of triangulation, a method of adjusting direction of advance of the laser beam reflected from the liquid surface by utilizing slope of an undulation produced regularly in the liquid surface whose level is to be detected.

8. A method of detecting a level of a surface by emitting a laser beam from a prescribed position relative to the surface whose level is to be detected, and receiving the laser beam reflected from the surface whose level is to be detected, at a prescribed position different from the first-mentioned prescribed position whereby the level of the surface is detected based on principle of triangulation, wherein the method is a method for detecting a level of a surface that is emitting light, and reception of the laser beam is selectively performed by using a laser beam having a light intensity stronger than a light intensity of the surface whose level is to be detected, while receiving the laser beam through a beam attenuating filter positioned at an energy level between the light intensity of the laser beam and the light intensity of the surface.

9. A melt level detection apparatus comprising a laser beam projector and a photodetector at prescribed positions in a CZ furnace, wherein the laser beam projector projects a laser beam emitted from onto a surface of a melt, the photodetector receives the laser beam reflected from a site where the laser beam is projected, and a level of the surface of the melt inside the CZ furnace is detected based on principle of triangulation, wherein a position at which the laser beam projector projects is moved in radial directions of a crucible inside the CZ furnace, whereby the laser beam reflected from the surface of the melt scans a projection position at which the laser beam is received by the photodetector, and projection position of the laser beam is set at the position, whereby the level of the surface of the melt is detected.

10. The melt level detection apparatus according to claim 1, further comprising:

first light path alteration means for altering path of advance of the laser beam emitted from the laser beam projector and projecting the laser beam onto the surface of the melt; and second light path alteration means for altering path of advance of the laser beam reflected from the surface of the melt and guiding the laser beam to the photodetector.

11. The melt level detection apparatus according to claim 10, wherein alteration of position to projection by the laser beam projector is performed by the first and second light path alteration means.

12. The melt level detection apparatus according to claim 11, further comprising a beam attenuating filter which blocks light of a prescribed light intensity or below of light received by the photodetector.

13. The melt level detection apparatus according to claim 11, further comprising an angle adjusting mechanism which adjusts projection angle of the laser beam projector.

14. The melt level detection apparatus according to claim 10, further comprising a beam attenuating filter which blocks light of a prescribed light intensity or below of light received by the photodetector.

15. The melt level detection apparatus according to claim 10, further comprising an angle adjusting mechanism which adjusts projection angle of the laser beam projector.

16. The melt level detection apparatus according to claim 1, further comprising a beam attenuating filter which blocks light of a prescribed light intensity or below of light received by the photodetector.

17. The melt level detection apparatus according to claim 16, further comprising an angle adjusting mechanism which adjusts projection angle of the laser beam projector.

18. The melt level detection apparatus according to claim 1, further comprising an angle adjusting mechanism which adjusts projection angle of the laser beam projector.

19. The melt level detection apparatus according to claim 1, wherein the scanning of the projection position by the laser beam projector is performed up to a bottom portion of a heat shielding member disposed inside the CZ furnace, and position of the bottom portion of the heat shielding member is calculated by receiving also the laser beam reflected from bottom portion of the heat shielding member with the photodetector.

20. The melt level detection apparatus according to claim 1, wherein the photodetector comprises a two-dimensional photosensor which simultaneously detects two-dimensional positions of a measurement spot on an observation surface.

21. A melt level detection apparatus comprising a laser beam projector, a photodetector at prescribed positions in a CZ furnace, and light path alteration means for altering path of advance of the laser beam emitted from the laser beam projector and projecting the laser beam onto the surface of the melt, wherein the laser beam projector projects a laser beam emitted from onto a surface of a melt, the photodetector receives the laser beam reflected from a site where the laser beam is projected, and a level of the surface of the melt inside the CZ furnace is detected based on principle of triangulation, wherein a position at which the laser beam projector projects is moved in radial directions of a crucible inside the CZ furnace, whereby the laser beam reflected from the surface of the melt scans a projection position at which the laser beam is received by the photodetector, and projection position of the laser beam is set at the position, whereby the level of the surface of the melt is detected.

22. A melt level detection apparatus comprising a laser beam projector, a photodetector at prescribed positions in a CZ furnace, and light path alteration means for altering path of advance of the laser beam reflected from the surface of the melt and guiding the laser beam to the photodetector, wherein the laser beam projector projects a laser beam emitted from onto a surface of a melt, the photodetector receives the laser beam reflected from a site where the laser beam is projected, and a level of the surface of the melt inside the CZ furnace is detected based on principle of triangulation, wherein a position at which the laser beam projector projects is moved in radial directions of a crucible inside the CZ furnace, whereby the laser beam reflected from the surface of the melt scans a projection position at which the laser beam is received by the photodetector, and projection position of the laser beam is set at the position, whereby the level of the surface of the melt is detected.

* * * * *